United States Patent [19]

Erickson et al.

[11] Patent Number: 5,600,271
[45] Date of Patent: Feb. 4, 1997

[54] INPUT SIGNAL INTERFACE WITH INDEPENDENTLY CONTROLLABLE PULL-UP AND PULL-DOWN CIRCUITRY

[75] Inventors: Charles R. Erickson, Fremont; Peter H. Alfke, Los Altos Hills, both of Calif.

[73] Assignee: Xilinx, Inc., San Jose, Calif.

[21] Appl. No.: 528,580

[22] Filed: Sep. 15, 1995

[51] Int. Cl.⁶ .................................. H03K 19/084
[52] U.S. Cl. .................... 327/108; 327/332; 327/333; 327/538
[58] Field of Search ................ 327/331–3, 538, 327/108; 326/86

[56] References Cited

U.S. PATENT DOCUMENTS

| | | | |
|---|---|---|---|
| 4,713,557 | 12/1987 | Carter | 326/86 |
| 4,763,023 | 8/1988 | Spence | 326/86 |
| 4,766,334 | 8/1988 | Warner | 326/86 |
| 4,825,099 | 4/1989 | Barton | 326/86 |
| 5,164,612 | 11/1992 | Kaplinsky | 327/108 |
| 5,225,772 | 7/1993 | Gotou et al. | 327/333 |
| 5,497,108 | 3/1996 | Menon et al. | 326/86 |

Primary Examiner—Margaret Rose Wambach
Attorney, Agent, or Firm—Edel M. Young; Anthony C. Murabito

[57] ABSTRACT

An input interface circuit for a logic device having a configuration of pull-up and pull-down devices for defining the logic level based on an undriven input signal where the pull-up and pull-down devices are independently and separately programmable to follow the input signal (e.g., a keeper circuit), or follow the inverse of the input signal, or programmed permanently on, or programmed permanently off. The interface circuit can be used to provide a known and programmable output signal for an IC input (or internal line) that does not have a known driving source. By allowing this degree of flexibility, the input interface circuit of the present invention, under programmed control, generates an output signal with positive or negative feedback based on the input signal; or the input interface circuit provides a constant high or constant low signal output, or can oscillate or provide a high impedance response as output. In cases when the input pin (or internal line) is not being driven by a bus or source driver, the input interface provides a number of flexible configurations for supplying predetermined outputs. Within a programmable logic device, a separate input interface circuit is provided with each external pad (or internal line) that provides signals within the integrated circuit originating from associated input pins.

20 Claims, 8 Drawing Sheets

| 12 | 13 | 21 | CIRCUIT |
|---|---|---|---|
| 0 | X | 1 | KEEPER |
| X | X | 0 | OPEN |
| 1 | 0 | 1 | 0 (PULL-DOWN) |
| 1 | 1 | 1 | 1 (PULL-UP) |

FIG. 5

| 21 | 22 | 23 | CIRCUIT |
|---|---|---|---|
| 0 | 0 | 0 | 0 (PULL-DOWN) |
| 0 | 0 | 1 | OPEN |
| 0 | 1 | 0 | DIVIDER |
| 0 | 1 | 1 | 1 (PULL-UP) |
| 1 | X | X | KEEPER |

FIG. 7

INPUT SIGNAL INTERFACE WITH INDEPENDENTLY CONTROLLABLE PULL-UP AND PULL-DOWN CIRCUITRY

BACKGROUND OF THE INVENTION (1) Field of the Invention

The present invention relates to the field of input signal interface circuits. More particularly, the present invention relates to an input interface circuit useful for controlling input signal lines within an integrated circuit device.

(2) Background of the Invention

Signals are often carried to an integrated circuit (IC) via an input pin of the IC which is also coupled to an external pad within the IC. Other signals are carried within an IC from one portion of the IC to another portion of the IC; these signals can also be called input signals. A significant problem exists with present circuit designs regarding input signal lines to an IC when the input signal characteristics (e.g., voltage, driving source) are unknown. With respect to complementary metal oxide semiconductor (CMOS) technology, for example, the voltage applied to an input pin over a bus is in many instances unknown because the source driver can be switched during operation, removed completely, or in a power conservation mode. In these instances when no source device is driving the input pin, the voltage seen by the integrated circuit over its associated external pad may be unknown and may be driven with a very weak high or weak low signal or may simply "float." Likewise, certain internal lines in an IC can float to an unknown voltage. In such conditions, there may be amplification of ambient noise, as well as excessive power dissipation associated with the input pin of the IC device or with an internal line of the IC device. Therefore, it is desired to provide a known or predicted voltage that can be applied to each input pin of an IC device even during conditions when the connected bus does not have a driving source or the bus is disconnected or electronically isolated. To this end, it is also desired to provide flexibility in generating signal outputs from an interface circuit based on signals received over an input pin that may not have a driving source. The present invention offers this functionality.

One method of preventing input pins or internal lines from floating at unknown or unstable voltages, caused by leakage currents on a line, is to provide a pull-up or pull-down resistance. Using such mechanisms, in the event that the normal driving source is mechanically disconnected or electrically not driven, as in a tri-state bus, the resistor provides a defined level for the input pin. For tri-state buses, use of pull-up or pull-down resistors may result in unnecessarily changing the logic level of many of the lines as the bus changes from one driving source to another.

The use of a circuit to minimize floating by retaining the last voltage applied is also known in the art. Such circuits are often referred to as "keeper circuits". FIG. 1 is a schematic diagram of a prior art keeper circuit 90. With respect to this prior art device, a pair of inverters 100 communicate an input signal 102 through a feedback impedance 104, which in this example is a resistor 104. The signal then reinforces the logic value.

The output state of the prior art circuit 90 of FIG. 1 is therefore determined by the last state of the input signal at an input terminal 98, and this state is maintained by the keeper circuit if the normal source is removed or if the normal source becomes tri-stated. An amplifier/buffer circuit 99 communicates the 'kept' state to a logic circuit which, in this example, is a logic array.

Signal interface circuitry has been known to utilize an interface that contains an active keeper circuit in conjunction with a pull-up transistor where the pull-up transistor can be programmed out of the interface and where the keeper circuit is always present. This design does not offer as much flexibility as desired because the keeper circuit is always active in the interface and only the pull-up transistor can be programmed in or out. Further, this design has only been applied to internal lines of a logic device and has not been applied to external pads of the IC (e.g., those coupled to receive signals from the input pins of the IC).

In addition, pull-up transistors and pull-down transistors have been applied to external pads of a logic device. However only one of the transistors is allowed to be programmed permanently "on" at a time, while both can be programmed permanently "off." This design does not offer as much flexibility as desired because the pull-up and pull-down devices are limited in their configuration with respect to each other and are programmed only in permanent states. Further, in this application there is no keeper circuit function.

Accordingly, it is desired to provide an input interface circuit having the flexibility to independently control a set of pull-up and pull-down transistors such that multiple configurations can be obtained, including a keeper arrangement. It is further desired to apply such interface circuit to an external pad of an IC device which is coupled to receive signals from an input pin. It is also desired to provide the above flexibility such that each transistor in the above configuration can be independently programmed permanently off, or programmed permanently on, or programmed to follow the input voltage, or follow the inverse of the input voltage. It is desired to provide this interface circuit for each external pad of the IC device using circuitry that is internal to the IC device. These and other aspects of the present invention not specifically recited above will become clear within discussions of the present invention to follow.

SUMMARY OF THE INVENTION

An input interface circuit is described for a logic device having a configuration of pull-up and pull-down devices for defining the logic level on an undriven input signal where the pull-up and pull-down devices are independently and separately programmable to follow the input signal (e.g., a keeper circuit), or follow the inverse of the input signal, or programmed permanently on, or programmed permanently off. The interface circuit of the present invention can be used to provide a known and programmable output signal for an IC input node (external pad), or for an internal line, that does not have a known driving source. By allowing this degree of flexibility, the input interface circuit of the present invention, under programmed control, generates an output signal with positive or negative feedback based on the state of the input signal; or based on the state of configuration bits the input interface circuit provides a constant high or constant low signal output, or provides a high impedance response. Within a programmable logic device, a separate input interface circuit is provided for each external pad that supplies signals into the integrated circuit which originate from an input pin and for each internal line. General embodiments of the present invention are illustrated which offer a high degree of flexibility along with other particular embodiments offering less flexibility but with circuit designs of reduced complexity.

More specifically, embodiments of the present invention include a configurable input interface circuit including: an input receiving node for receiving an input signal; a pull-up device coupled to the receiving node for pulling the receiving node to a first logic state under control from a first control signal; a pull-down device coupled to the receiving node for pulling the receiving node to a second logic state under control from a second control signal; a memory device for containing control configuration information; and an internal interface circuit coupled to receive the input signal and coupled to receive the configuration information, the internal interface circuit for generating the first control signal and the second control signal wherein the pull-up device and the pull-down device are independently controllable to be permanently on, permanently off, or independently controllable to be on or off as a function of the input signal.

Embodiments of the present invention include the above and wherein the internal interface circuit is also for generating the first control signal and the second control signal to independently control the pull-up device and the pull-down device to be on or to be off as a function of an inverse of the input signal. Embodiments of the present invention include the above and wherein the internal interface circuit further generates an output signal dependent on logical states of the pull-up device and the pull-down device. Embodiments also include the above and wherein the pull-up device is a transistor and the pull-down device is a transistor and wherein the first logic state is a high voltage state and the second logic state is a low voltage state.

Embodiments include the above and wherein the internal interface circuit comprises a look-up table addressed by the configuration information and also by the input signal and generates the first control signal and the second control signal as outputs. Embodiments include the above and wherein the internal interface circuit includes: a first multiplexer for generating the first control signal wherein the first multiplexer is coupled to receive the configuration information for selection control and wherein the first multiplexer receives the input signal and a logical high and a logical low state as inputs; and a second multiplexer for generating the second control signal wherein the second multiplexer is coupled to receive the configuration information for selection control and wherein the second multiplexer receives the input signal and a logical high and a logical low state as inputs.

In another particular embodiment, the present invention provides an input interface circuit for a logic device interconnection wherein an inverted input signal is communicated to a multiplexer and the multiplexer output signal is determined by programmable devices and the state of the input signal. This output signal is communicated to the input via an inverter, a p-channel device, and an n-channel device, controlled by an additional memory cell. The circuit is thus selectably operable as a keeper circuit with logical feedback, or as an open circuit with the n-channel and p-channel devices off, or can communicate fixed resistive logic low or high signals to the logic input depending on the state of the n-channel and p-channel devices.

BRIEF DESCRIPTION OF THE DRAWINGS

FIG. 5 is a truth table for the circuit embodiment of FIG. 4.

FIG. 7 is a truth table for the circuit embodiment of FIG. 6.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances, well known methods, procedures, components, and circuits have not been described in detail as not to unnecessarily obscure aspects of the present invention.

The present invention provides various embodiments of an input interface circuit that are utilized to interface an input signal (e.g., transmitted over an integrated circuit pad) with the remainder of the circuitry within the integrated circuit. In lieu of an external input line, the embodiments of the present invention are equally applicable to an internal input line of an IC device that runs from one IC portion to another IC portion of the same device. In such case, the input interface circuitry, to be described below, provides a predictable output signal for an internal input line.

In a particular application of the present invention, circuitry relating to an external pad of the integrated circuit contains three operational modes including a strong driving mode, a weak driving mode and a non-driven mode. Under the strong driving mode, an output driver is typically provided to drive the external pad. Throughout discussions of the present invention, it is assumed that the strong driving mode associated with the external pad of the IC is disabled and that the strong external driver is therefore tri-stated. Aspects of the present invention relate to the weak driving configuration of the external pad and these are discussed in more detail below.

Figure 2A:
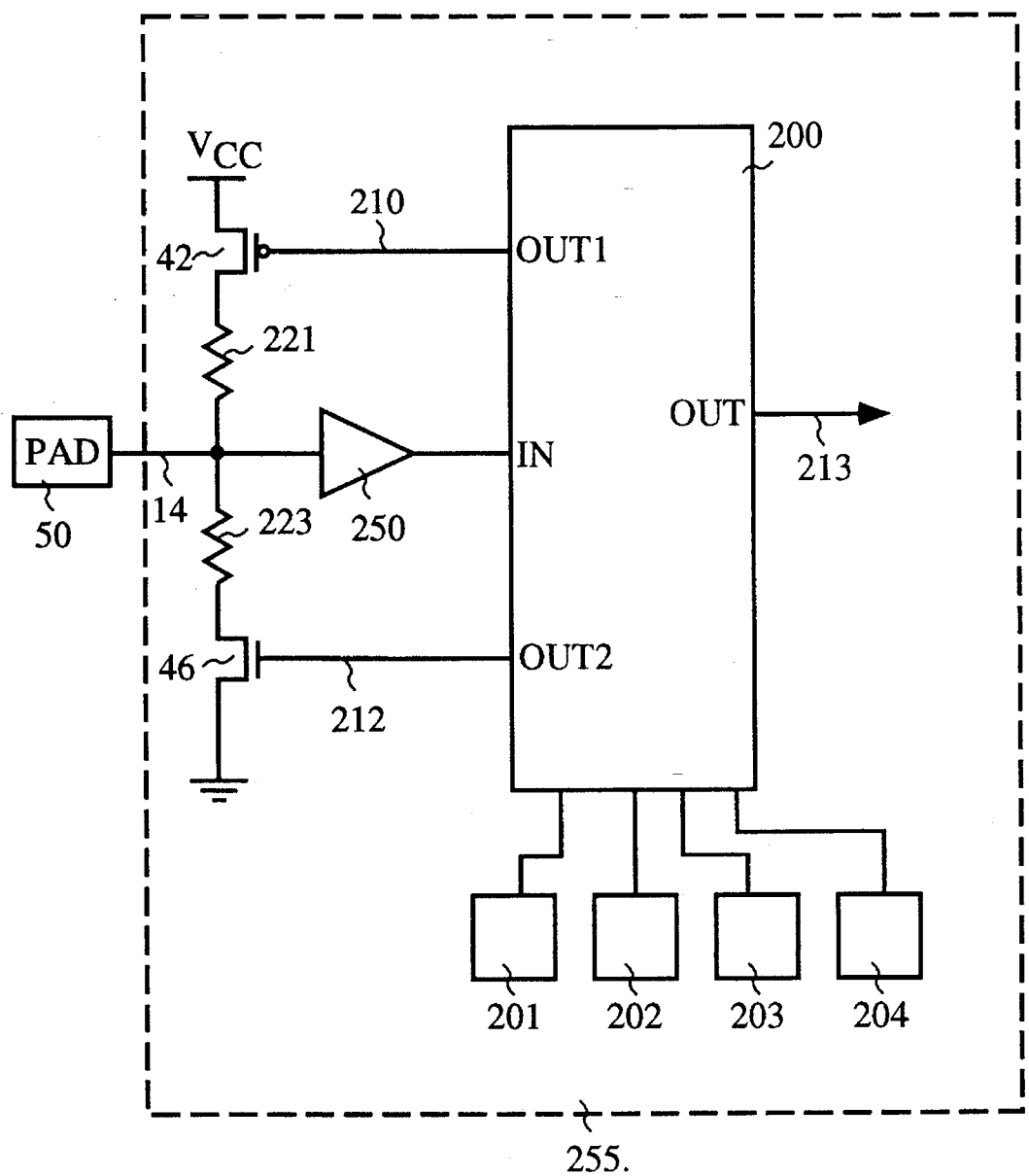
FIG. 2A is a high level block diagram of an embodiment of the present invention offering 16 programmable configurations for its output signal based on the input signal and configuration information stored in programmable memory units.

FIG. 2A illustrates an embodiment of the present invention input interface circuit 255 offering 16 different configurations with respect to generating an output signal 213 in response to an input signal and certain configuration information. In other words, the embodiment of FIG. 2A allows 16 possible ways to independently control the pull-up 42 and pull-down 46 devices from the pin level. The input interface circuit 255 of the present invention is used to provide a known and programmable output signal 213 in response to an input signal that is carried over external pad (or node) 50 and line 14. The present invention input interface circuit 255 is useful in cases where the external pad 50 is not coupled to a known source driver (e.g., because the source driver is disconnected or tri-stated or asleep, etc.). The present invention input interface circuit 255 provides a mechanism to control the output signal 213 to a predictable state by controlling weak pull-up 42 and pull-down 46 load resistors (transistors) in a variety of different configurations.

In this manner, a purpose of the input interface circuit 255 is to provide a predictable signal output 213 in cases when the external pad 50 is not being driven by a source driver (e.g., the bus is disconnected, disabled or asleep, etc.). In so doing, the present invention offers a variety of programmable configurations for providing the output signal, including configurations that always pull the signal up to a logical high state, always pull the signal down to a logical low state, provide a keeper function, provide an inverse keeper function, provide a divider function, or provide a configuration that may not affect the input signal at all (e.g., tri-state mode).

As discussed above, the present invention is equally applicable to an internal input signal 14 which can alternatively be fed over line 14. The internal input signal in this case originates from one portion of the IC and can be sent to another portion of the IC or sent off chip. In such case, pad 50 is considered an internal input receiving node.

According to the present invention, each of the pull-up 42 and pull-down 46 devices can be programmed to: 1) be controlled by the input signal; 2) be controlled by the inverse of the input signal; 3) be in the on state permanently; or 4) be in the off state permanently. Since there are two independently controllable devices 42 and 46 each having four different states, the input interface circuit 255 of the present invention offers 16 different programmable states which are selected via configuration information that is programmed into circuit 255.

The circuitry of FIG. 2A is provided within an IC, such as a programmable logic device. Particularly, a pull-up device 42 (e.g., p-channel transistor) of FIG. 2A is coupled to Vcc and coupled through a resistor 221 to line 14 which is coupled to the external pad (or node) 50 of the IC device. Line 14 is also coupled to resistor 223 and to the pull-down device 46 (e.g., an n-channel transistor) which is coupled to ground. It is appreciated that with the proper logic modifications, the pull-up device can be an n-channel transistor and the pull-down device can be a p-channel transistor. Such modification is within the scope of the present invention. Line 14 is coupled to the input of a driver (or buffer) 250 which is coupled to the "IN" input port of internal interface logic block 200. The gate of pull-up transistor 42 is coupled to the OUT 1 output of block 200 and the gate of pull-down transistor 46 is coupled to the OUT2 output of block 200. In this configuration, block 200 controls the state of the pull-up 42 and the pull-down 46 devices via control signals generated over control lines 210 and 212. Interface logic block 200 generates an output signal over line 213 which is the output of the input interface circuit 255 of the present invention. Line 213 is typically used to drive other circuitry of the IC device. Since there are 16 different configurations in which the present invention can be programmed, in one implementation there are four 1-bit memory cells 201, 202, 203, and 204 that are coupled to control the selected configuration of block 200. These are the configuration bits which comprise configuration information. It is appreciated that a 4-bit register can also be implemented, in lieu of blocks 201–204, to contain the configuration information. Memories 201–204 can be implemented with RAM, ROM, EEPROM, EPROM, flash EEPROM, flash EPROM, PROM, or a number of other well known memory technologies. In one implementation, memory cells 201–202 control the configuration of the pull-up device 42 and memory cells 203–204 control the configuration of the pull-down device 46. Exemplary truth tables in Table I and Table II are provided below illustrating the possible configurations for each device 42 and 46.

As shown, each device is independently configurable.

TABLE I

| Cell 201 | Cell 202 | State of Pull-Up Device 42 |
|---|---|---|
| 0 | 0 | Permanently ON |
| 0 | 1 | Permanently OFF |
| 1 | 0 | Inverse of Input |
| 1 | 1 | Follow the Input |

TABLE II

| Cell 203 | Cell 204 | State of Pull-Down Device 46 |
|---|---|---|
| 0 | 0 | Permanently OFF |
| 0 | 1 | Permanently ON |
| 1 | 0 | Inverse of Input |
| 1 | 1 | Follow the Input |

Depending on the particular application, the memory devices 201–204 of the input interface circuit 255 of the present invention can be programmed to realize any of the 16 different modes of operation. Since each external pad 50 has its own separate input interface circuit 255 associated therewith, each external pad can be programmed with a different configuration state. In this way, the present invention circuit 255 offers a high degree of flexibility in its control of the weak pull-up 42 and pull-down 46 devices to produce different output signals 213. For instance, if a keeper circuit is desired, then the pull-up device 42 and the pull-down device 46 can both be programmed to follow the input signal over line 14. For an inverse keeper or "contrary" circuit (e.g., often used for an oscillator), both devices 42 and 46 can be programmed to drive the opposite direction of the input signal (e.g., follow the inverse of the input signal). However, if it is desired that a weak pull down configuration always be asserted, then the pull-down device 46 can be programmed permanently on and the pull-up device 42 can be programmed permanently off. Likewise, if it is desired that a weak pull up configuration always be asserted, then the pull-down device 46 can be programmed permanently off and the pull-up device 42 can be programmed permanently on. Or, alternatively, a tri-state condition can be implemented wherein both the pull-down device 46 and the pull-up device 42 are programmed permanently off. A Thevenin divider configuration can be implemented wherein both the pull-down device 46 and the pull-up device 42 are programmed permanently on. Of course, in addition to the listed configurations above, there are a number of additional configurations that can be realized based on the combination of the truth tables above. In typical fashion, once a particular input signal configuration is identified for a particular external node, the proper configuration information is programmed into memory units 201–204 (in one implementation) that are associated with the external pad. The associated input interface circuit 255 will then generate the proper output signal over line 213 in cases when the external pad does not have a driving source. In accordance with the present invention, this can be done for each external pad of an integrated circuit, such as a programmable logic device.

Figure 2B:
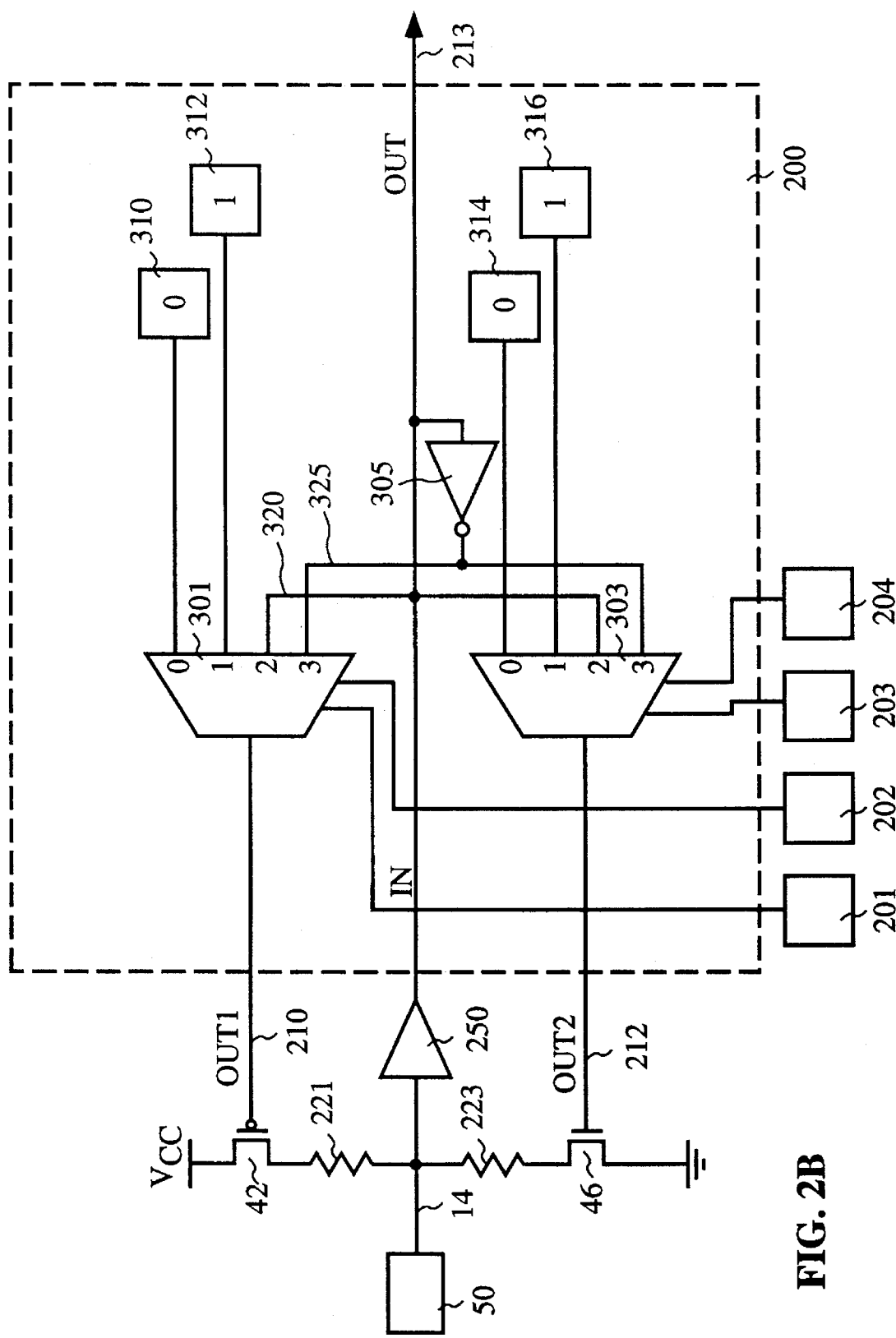
FIG. 2B is a schematic diagram of a particular implementation of the embodiment of the present invention offering 16 programmable configurations wherein the embodiment is realized using devices including multiplexers generating control signals.
Figure 2C:
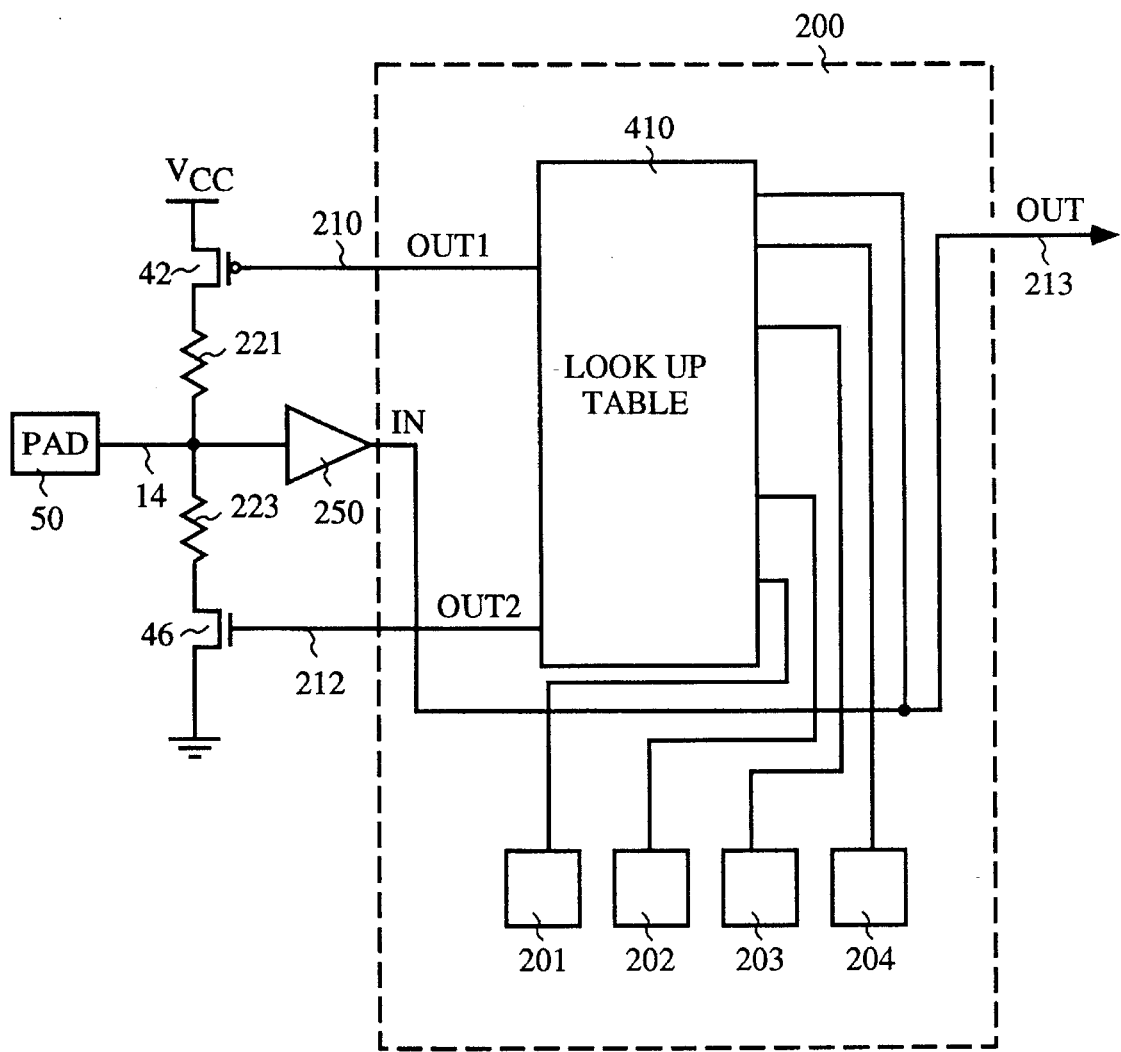
FIG. 2C is a schematic diagram of a particular implementation of the embodiment of the present invention offering 16 programmable configurations wherein the embodiment is realized using a look-up table (e.g., stored in a memory device) for generating control signals.

It is appreciated that there are a number of implementations that can be utilized to realize the truth tables of Table I and Table II. The implementations of the internal interface block 200 of the present invention shown in FIG. 2B and FIG. 2C are exemplary and it is appreciated that there are other ways in addition to these implementations that come within the spirit and scope of the present invention. FIG. 2B illustrates one such implementation of block 200 using a pair of multiplexers 301 and 303. Input line 14 is fed to driver/buffer 250 whose output is input to the IN port of block 200. Mux 301 controls the pull-up device 42 and is coupled to the gate of device 42 over control line 210 which originates from the OUT1 port of block 200. Mux 303 controls the pull-down device 46 and is coupled to the gate of device 46 over control line 212 which originates from the OUT2 port of block 200. The line0 input of mux 301 is coupled to a logical zero via memory cell 310 and the line1 input of mux 301 is coupled to a logical one via memory cell 312. The line2 input of mux 301 is coupled to receive the buffered input signal 14 from driver 250. The line3 input of mux 301 is coupled to receive the buffered reverse input signal 14 from inverter 305. Memory cells 201 and 202 are coupled to control the selection of mux 301 wherein cell 202 is the LSB of the selection control information, see Table I.

The line0 input of mux 303 of FIG. 2B is coupled to a logical zero via memory cell 314 (which can be a pull down device) and the line1 input of mux 303 is coupled to a logical one via memory cell 316 (which can be a pull up device). The line2 input of mux 303 is coupled to receive the buffered input signal 14 from driver 250. The line3 input of mux 303 is coupled to receive the buffered reverse input signal 14 from inverter 305. Memory cells 203 and 204 are coupled to control the selection of mux 303 wherein cell 204 is the LSB of the selection control information, see Table II. Block 200 of the present invention generates an output signal 213 (over the OUT port) according to the selected configuration programmed by the configuration information stored in memory cells 201–204 and based on the level on pad 50. It is appreciated that since each mux 301 and 303 can be separately programmed to realize one of four possible configurations, the design shown in FIG. 2B offers 16 different configurations for controlling the weak pull-up and pull-down devices 42 and 46, respectively. It is also appreciated that the pull-up 42 and pull-down 46 devices can be implemented with either n-channel or p-channel transistors and such modification requires a reassignment of some or all of the select input lines for mux 301 and/or mux 303. This modification is considered to be within the scope of one of ordinary skill in the art.

FIG. 2C illustrates an implementation of the present invention internal interface block 200 that utilizes a look-up table 410 that can be stored in a memory unit (e.g., RAM, ROM, EEPROM, EPROM, flash EEPROM, flash EPROM, PROM, etc.). The contents of the memory unit 410 are used to control the signal lines 210 and 212 and thus are used to control the pull-up 42 and pull-down 46 devices. Line is coupled to driver/buffer 250 which is input to the IN port of block 200. Memory cells 201,202, 203 and 204 and the output of driver/buffer 250 comprise the address of the look-up table 410 and are all coupled to the address lines of the look-up table 410. In one implementation the output of driver/buffer 250 is the MSB of the address while the memory cell 204 is the LSB of the address. The look-up table 410 generates a two bit output for each addressed input. These bits are independent of each other. One output bit of look-up table 410 is coupled to control line 210 (OUT1 port of block 200) and is coupled to the gate of the pull-up device 42. The other bit is coupled to control line 212 (OUT2 port of block 200) and is coupled to control the gate of the pull-down device 46. The output of block (OUT port) is driven over line 21 3.

Tables III and IV illustrate the contents of the look-up table 410 that are used to implement the logic as shown in FIG. 2B.

TABLE III

Input is 0

| INPUT CONDITION | | | | | RESULT | |
|---|---|---|---|---|---|---|
| IN | 201 | 202 | 203 | 204 | Line 210 | Line 212 |
| 0 | 0 | 0 | 0 | 0 | 0 | 0 |
| 0 | 0 | 0 | 0 | 1 | 0 | 1 |
| 0 | 0 | 0 | 1 | 0 | 0 | 0 |
| 0 | 0 | 0 | 1 | 1 | 0 | 1 |
| 0 | 0 | 1 | 0 | 0 | 1 | 0 |
| 0 | 0 | 1 | 0 | 1 | 1 | 1 |
| 0 | 0 | 1 | 1 | 0 | 1 | 0 |
| 0 | 0 | 1 | 1 | 1 | 1 | 1 |
| 0 | 1 | 0 | 0 | 0 | 0 | 0 |
| 0 | 1 | 0 | 0 | 1 | 0 | 1 |
| 0 | 1 | 0 | 1 | 0 | 0 | 0 |
| 0 | 1 | 0 | 1 | 1 | 0 | 1 |
| 0 | 1 | 1 | 0 | 0 | 1 | 0 |
| 0 | 1 | 1 | 0 | 1 | 1 | 1 |
| 0 | 1 | 1 | 1 | 0 | 1 | 0 |
| 0 | 1 | 1 | 1 | 1 | 1 | 1 |

TABLE IV

Input is 1

| INPUT CONDITION | | | | | RESULT | |
|---|---|---|---|---|---|---|
| IN | 201 | 202 | 203 | 204 | Line 210 | Line 212 |
| 1 | 0 | 0 | 0 | 0 | 0 | 0 |
| 1 | 0 | 0 | 0 | 1 | 0 | 1 |
| 1 | 0 | 0 | 1 | 0 | 0 | 1 |
| 1 | 0 | 0 | 1 | 1 | 0 | 0 |
| 1 | 0 | 1 | 0 | 0 | 1 | 0 |
| 1 | 0 | 1 | 0 | 1 | 1 | 1 |
| 1 | 0 | 1 | 1 | 0 | 1 | 1 |
| 1 | 0 | 1 | 1 | 1 | 1 | 0 |
| 1 | 1 | 0 | 0 | 0 | 1 | 0 |
| 1 | 1 | 0 | 0 | 1 | 1 | 1 |
| 1 | 1 | 0 | 1 | 0 | 1 | 1 |
| 1 | 1 | 0 | 1 | 1 | 1 | 0 |
| 1 | 1 | 1 | 0 | 0 | 0 | 0 |
| 1 | 1 | 1 | 0 | 1 | 0 | 1 |
| 1 | 1 | 1 | 1 | 0 | 0 | 1 |
| 1 | 1 | 1 | 1 | 1 | 0 | 0 |

As shown by the tables above, the implementation of block 200 shown in FIG. 2C can be programmed in a keeper configuration wherein the value of the input signal 14 is determinative of the output signals over line 210 and 212. The same is true for the inverse keeper (contrary) configuration. However, in those configurations where the pull-up device 42 is programmed permanently ON or permanently OFF, the value of the input line 14 does not determine the value of the signal over control line 210. Likewise in those configurations where the pull-down device 46 is programmed permanently ON or permanently OFF, the value of the input line 14 does not determine the value of the signal over control line 212.

It is appreciated that the truth tables of Table I and Table II apply to the bit configurations of the memory cells 201–204 of Table III and Table IV. For instance, when cells 201 and 202 are both "1" then the pull-up device 42 is programmed to follow the input. When cells 203 and 204 are both "1" then the pull-down device 46 is programmed to follow the input. This is a keeper arrangement. According to Table III and Table IV, when the input is "0", line 210 is "1" and line 212 is "1" and this configuration pulls the node 14 down. Further, when the input is "1", line 210 is "0" and line 212 is "0" and this configuration pulls up node 14. Also, when cells 201 and 202 are both "0," then the pull-up device 42 is permanently ON. When cells 203 and 204 are both "0," then the pull-down device 46 is permanently OFF. This is a permanent pull-up configuration, and regardless of the value of the input over line 14, the look-up table 410 outputs "0" over line 210 and "0" over line 212. When cell 201 is "0" and 202 is "1," then the pull-up device 42 is permanently OFF. When cell 203 is "0" and 204 is "1," then the pull-down device 46 is permanently ON. This is a permanent pull-down configuration, and regardless of the value of the input over line 14, the look-up table 410 outputs "1" over line 210 and "1" over line 212.

Figure 3:
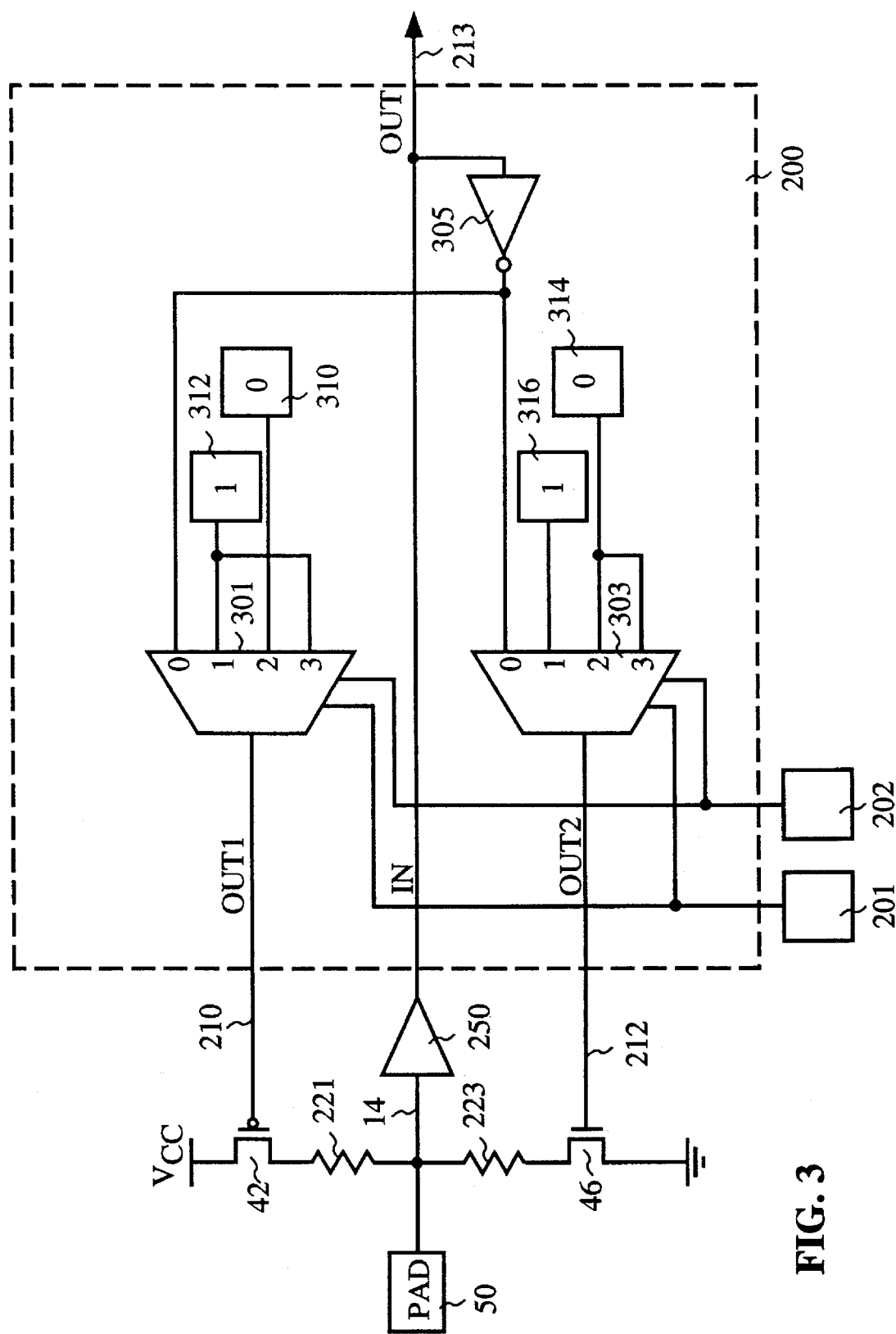
FIG. 3 is a schematic diagram of an embodiment of the present invention offering four separate programmable configurations for generating the output signal.

The embodiments of the present invention shown in FIG. 2A, FIG. 2B and FIG. 2C can be simplified to recognize only a subset of the 16 possible combinations described above. FIG. 3 illustrates an embodiment of the present 5 invention that recognizes only 4 of the 16 possible combinations and correspondingly requires only two configuration bits for programming. The programmable configurations for this embodiment are: 1) keeper circuit; 2) tristate; 3) pull-up; and 4) pull-down. Although there are many implementations that can realize this simplified embodiment (including a look-up table implementation), an exemplary circuit implementation is shown in FIG. 3.

As shown in FIG. 3, the internal interface block 200 is coupled to the pull-up 42 and pull-down 46 devices via control lines 210 and 212, respectively, and receives the buffered input line 14 through driver/buffer 250. Multiplexer 301 receives the inverted value of the input 14 over select0 input from inverter 305. Mux 301 receives a logic "1" over line1 and line3 inputs (via memory cell 312, which can also be a pull up device) and receives a logic "0" over line2 input via memory cell 310. Mux 301 outputs over control line 210 to control the pull-up device 42. Multiplexer 303 receives the inverted value of the input 14 over select0 input from inverter 305. Mux 303 receives a logic "0" over line2 and line3 inputs (via memory cell 314, which can also be a pull down device) and receives a logic "1" over line 1 input via memory cell 316. Mux 301 outputs over control line 212 to control the pull-down device 46.

Both mux 301 and mux 303 are controlled from select lines from configuration bits in memory units 201 and 202 (cell 202 is the LSB in one implementation). The output signal 213 is taken from the OUT port on block 200. In this embodiment, Table V illustrates the possible configurations that the internal interface block 200 can be programmed to recognize and implement in the particular embodiment of the present invention shown in FIG. 3. As discussed above, this embodiment offers the advantage of requiring only two programmable bits for complete configuration while still offering a wide range of flexible outputs.

TABLE V

| Cell 201 | Cell 202 | Configuration |
| --- | --- | --- |
| 0 | 0 | Keeper Circuit |
| 0 | 1 | Permanently Pull-Down |
| 1 | 0 | Permanently Pull-Up |
| 1 | 1 | Tri-State |

The following embodiments of the present invention illustrate particular implementations that realize different subsets of the 16 different configurations the present invention can use to provide control over the weak pull-up 42 and weak pull-down 46 devices. It is appreciated that these embodiments are exemplary and should not be construed as limiting the broad scope of the present invention.

Figure 1:
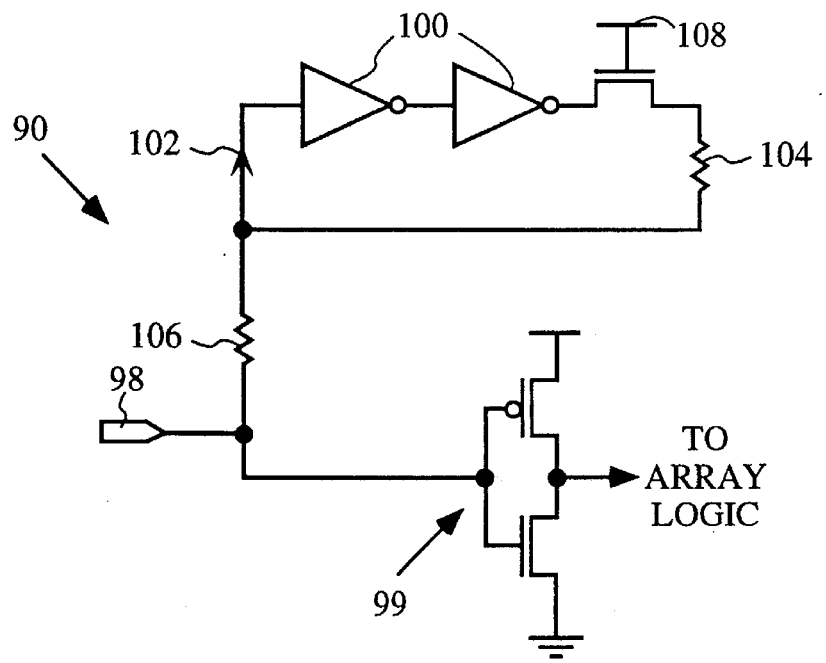
FIG. 1 is a block diagram of a prior art keeper circuit.
Figure 4:
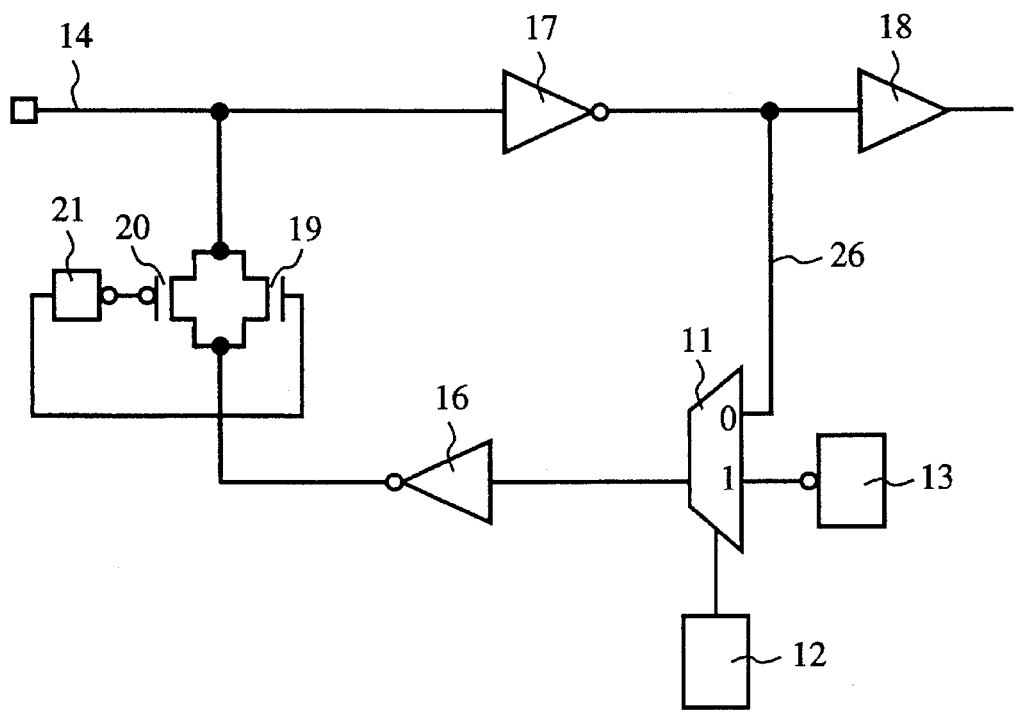
FIG. 4 is a schematic diagram of another embodiment of the input interface circuit according to the present invention.

FIG. 4 is a schematic diagram of an embodiment of an input interface circuit according to the present invention. In FIG. 4, an input signal on an input line 14 is communicated through first 17 and second 18 inverters. The signal can be communicated at one of two logic levels, e.g., a logic "1" or high level, and a logic "0" or low level. The inverted signal (output of inverter 17) is then communicated to a feedback loop 26. In this embodiment of the present invention, the signal is communicated to a multiplexer 11 that is responsive to the state of at least a first memory cell 12 and a second memory cell 13. The memory cells can include, for example, RAM, EPROMs, EEPROMs, flash EPROMs, and flash EEPROMs. The multiplexer 11 output signal is determined by the programmed logic levels of the memory cells 12 and 13.

FIG. 5 illustrates a truth table for the circuit of FIG. 4. When memory cell 12 is programmed to a logic 0 state, multiplexer 11 forwards the inverted input signal from inverter 17. In response to a logic 1 state in memory cell 12, multiplexer 11 forwards the inverted content of memory cell 13.

The signal communicated by multiplexer 11 is then inverted by an inverter 16 and provided to a p-channel transistor 20 and an n-channel transistor 19 that can be configured to conduct or not to conduct, as is known by those skilled in the art. A logic 0 state in configuration memory cell 21 communicates a logic 0 to the n-channel transistor gate and a logic 1 to the p-channel transistor gate, thereby causing the circuit to provide a high impedance feedback and act as an open circuit. The signal forwarded by multiplexer 11 is therefore not communicated back to input line 14. A logic 1 in the configuration memory cell 21 drives a logic 1 to the n-channel transistor gate, and a logic 0 to the p-channel transistor gate, thereby turning on both devices. The circuit then communicates the signal back to input line 14. When memory cell 21 is programmed as a logic 1 and memory cell 12 is programmed as a logic 0, the circuit acts as a keeper circuit. Under such conditions, the logic state communicated by the circuit is identical to the original input signal logic state. When the memory cells 12 and 21 are programmed as logic 1's, the p-channel and n-channel devices act as a load resistor at a level programmed by the memory cell 13. Memory cells 12 and 21 contain the configuration information (e.g., bits) for this embodiment.

Figure 6:
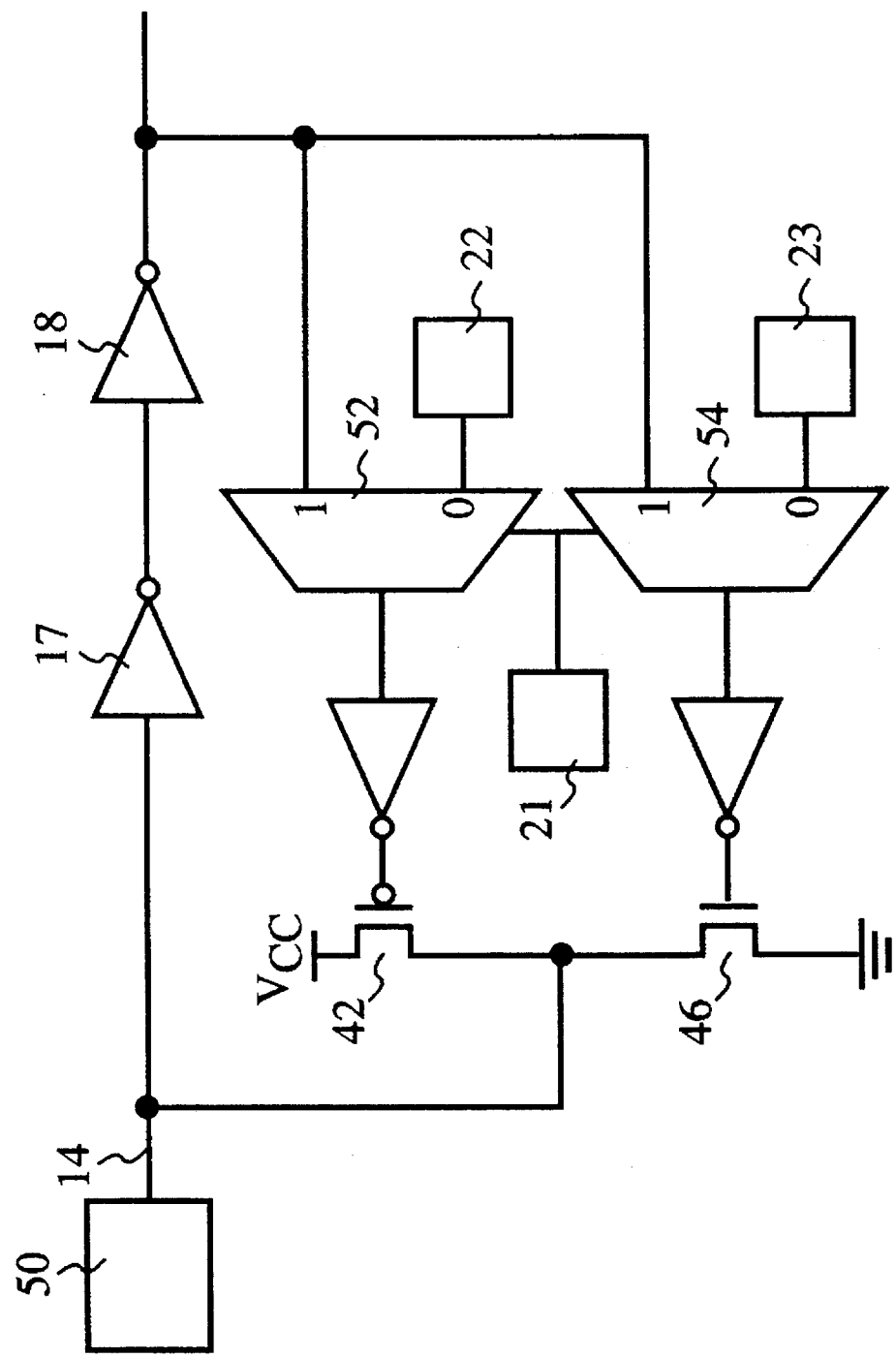
FIG. 6 is a schematic diagram of another embodiment of the input interface circuit according to the present invention.

FIG. 6 is a schematic diagram of another embodiment of an input interface circuit according to the present invention. In this embodiment, the pull-up device 42 (e.g., p-channel transistor) is controlled by an inverted output from multiplexer 52, and the pull-down device 46 (e.g., n-channel transistor) is controlled by an inverted output from multiplexer 54. The line 1 input for both multiplexers 52 and 54 are driven by the output of inverter 18 which is driven by an inverter 17 which is driven by input line 14. The line0 input for both multiplexers 52 and 54 are driven by programmable memory cells 22 and 23, respectively. Cells 21, 22 and 23 contain the configuration information (e.g., bits) for this embodiment of the present invention.

FIG. 7 is a truth table for the circuit of FIG. 4. When the configuration memory cell 21 is a logic 0, the internal configuration memory cells 22, 23 operate a respective pair of multiplexers 52, 54 to control the transistors 42, 46. When both memory cells are a logic 0, the n-channel transistor gate is turned on and a pull-down bias is subsequently communicated back to the input line 14. When both memory cells are a logic 1, the p-channel transistor gate is turned on, and a pull-up is provided. When configuration memory cell 22 is a logic 0, and the configuration memory cell 23 is a logic 1, the circuit is open; while the circuit operates as a divider when the configuration memory cell 22 is a logic 1 and the configuration memory cell 23 is a logic 0. Finally, when the configuration memory cell 21 is a logic 1, the multiplexers 52 and 54 forward the input logic state. Thus, the circuit of the present invention functions as a keeper circuit.

Figure 8:
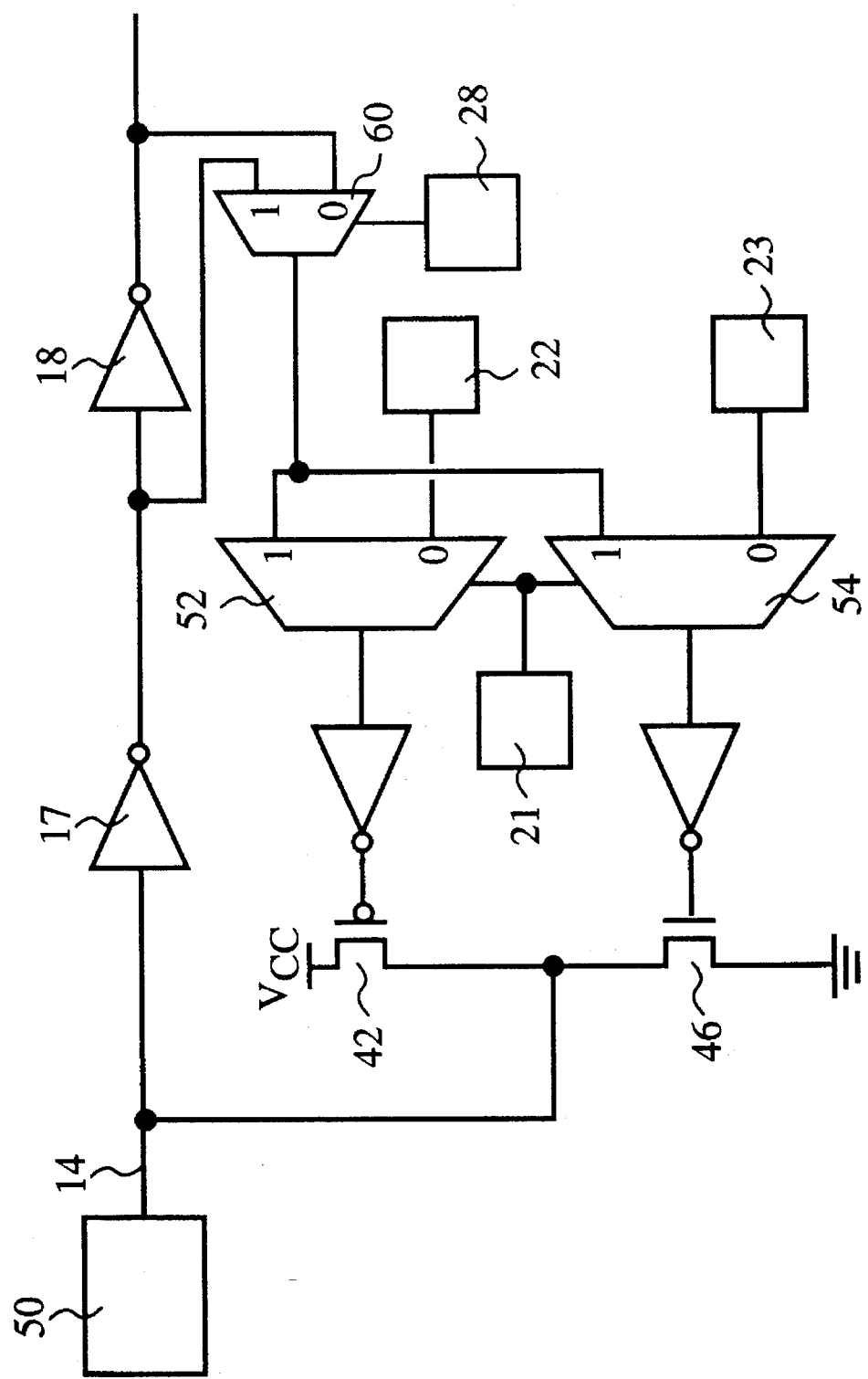
FIG. 8 is a schematic diagram of another embodiment of input interface circuit according to the present invention.

FIG. 8 is a schematic diagram of another embodiment of an input interface circuit according to the present invention. The addition of a third multiplexer 60 and configuration memory cell 28 allows the option of negative feedback as well as the resistive, and positive feedback (keeper) functions of the embodiment of the present invention shown in FIG. 6. This feature can be used to provide an active line termination (an active driver for controlling voltage on the line), or to produce a circuit that is able to detect a loss of interconnection. Loss of interconnection between a device which drives the line and the circuit of FIG. 8 can be detected by loss of current between the line and the circuit of FIG. 8 or by oscillation of the resulting line voltage. If desired, hysteresis can be added to the circuit to change oscillation or transmission line termination characteristics.

Specifically, the multiplexer 60 of FIG. 8 is coupled to receive, as one input, the output of inverter 18. The other input of mux 60 is supplied from inverter 17. Memory cell 28 allows selection between the two inputs. The output of the mux 60 is then fed into the select1 inputs of both mux 52 and 54 and thereby allows the additional selection of negative feedback for the embodiment of the present invention shown in FIG. 8. The configuration information for this embodiment of the present invention is stored in memory cells 21, 22, 23 and 28. Table VI below is a truth table of the different configurations available in the embodiment of the present invention shown in FIG. 8.

TABLE VI

| Cell 21 | Cell 22 | Cell 23 | Cell 28 | Circuit |
|---------|---------|---------|---------|---------|
| 0 | 0 | 0 | 0 | Pull Down |
| 0 | 0 | 1 | 0 | Open |
| 0 | 1 | 1 | 0 | Divider |
| 0 | 1 | 1 | 0 | Pull Up |
| 1 | X | X | 0 | Keeper |
| 1 | X | X | 1 | Negative |

As discussed above with respect to the embodiments shown in FIG. 2A, FIG. 2B, FIG. 2C and FIG. 3, the embodiments shown in FIG. 4, FIG. 6, and FIG. 8 can be associated with each external pad of an integrated circuit to provide signal control for any or all undriven inputs to the chip.

Although the invention is described herein with reference to several embodiments, one skilled in the art will readily appreciate that other applications can be substituted for those set forth herein without departing from the spirit and scope of the invention. For example, the input interface circuit of the present invention may be physically disconnected, or tri-stated from an external signal. Also, more than one voltage source or sink of varying sizes can be coupled to the circuit. Alternative embodiments of the present invention may include a plurality of coupled input interface circuits. Furthermore, although many embodiments of the present invention are described herein with the use of one or more multiplexers and with a look-up table, it will be appreciated by those skilled in the art that the function performed by the multiplexers and the look-up table can also be performed by other combinational logic circuits and configurations of circuits. While the discussed embodiments of the invention are for use with a programmable logic device, the invention can be applied to any digital circuit with the appropriate select signals.

The preferred embodiment of the present invention, a configurable input interface circuit having independently programmable pull-up and pull-down devices, is thus described. While the present invention has been described in particular embodiments, it should be appreciated that the present invention should not be construed as limited by such embodiments, but rather construed according to the below claims.

What is claimed is:

1. A configurable input interface circuit comprising:
   an input receiving node for receiving an input signal;
   a pull-up device coupled to said receiving node for pulling said receiving node to a first logic state under control from a first control signal;
   a pull-down device coupled to said receiving node for pulling said receiving node to a second logic state under control from a second control signal;
   a memory device for containing configuration information; and
   an internal interface circuit coupled to receive said input signal and coupled to receive said configuration information, said internal interface circuit for generating said first control signal and said second control signal wherein said pull-up device and said pull-down device are independently controllable to be permanently on, permanently off, or independently controllable to be on or off as a function of said input signal.

2. A configurable input interface circuit as described in claim 1 wherein said internal interface circuit is also for generating said first control signal and said second control signal to independently control said pull-up device and said pull-down device to be on or to be off as a function of an inverse of said input signal.

3. A configurable input interface circuit as described in claim 1 wherein said internal interface circuit further generates an output signal dependent on logical states of said pull-up device and said pull-down device.

4. A configurable input interface circuit as described in claim 1 wherein said pull-up device is a transistor and said pull-down device is a transistor and wherein said first logic state is a high voltage state and said second logic state is a low voltage state.

5. A configurable input interface circuit as described in claim 1 wherein said memory unit is a programmable memory unit and wherein said configuration information comprises logical bits programmed into said programmable memory unit.

6. A configurable input interface circuit as described in claim 1 wherein said internal interface circuit comprises a look-up table addressed by said configuration information and also by said input signal and generates said first control signal and said second control signal as outputs.

7. A configurable input interface circuit as described in claim 1 wherein said internal interface circuit comprises:

a first multiplexer for generating said first control signal wherein said first multiplexer is coupled to receive said configuration information for selection control and wherein said first multiplexer receives said input signal and a logical high and a logical low state as inputs; and a second multiplexer for generating said second control signal wherein said second multiplexer is coupled to receive said configuration information for selection control and wherein said second multiplexer receives said input signal and a logical high and a logical low state as inputs.

8. A configurable input interface circuit comprising:

an input receiving node for receiving an input signal, wherein said input receiving node is an external pad of an integrated circuit;

a pull-up transistor coupled to said receiving node for pulling said receiving node to a first logic state under control from a first control signal;

a pull-down transistor coupled to said receiving node for pulling said receiving node to a second logic state under control from a second control signal;

a programmable memory device for containing configuration bits for specifying a control mode for said pull-up and said pull-down transistors; and an internal interface circuit coupled to receive said input signal and coupled to receive said configuration bits, said internal interface circuit for generating said first control signal and said second control signal depending on said control mode wherein said pull-up device and said pull-down device are independently configurable to each be permanently on, permanently off, or independently configurable to each be on or off as a function of said input signal or as a function of an inverse of said input signal.

9. A configurable input interface circuit as described in claim 8 wherein said internal interface circuit further generates an output signal dependent on logical states of said pull-up transistor and said pull-down transistor.

10. A configurable input interface circuit as described in claim 9 wherein said control mode can be selected from 16 programmable states.

11. A configurable input interface circuit as described in claim 9 wherein said control mode can be selected from 4 programmable states including a keeper mode, a tri-state mode, a pull-up mode, and a pull-down mode.

12. A configurable input interface circuit as described in claim 9 wherein said internal interface circuit comprises a look-up table addressed by said configuration bits and said input signal and generates said first control signal and said second control signal as outputs.

13. A configurable input interface circuit as described in claim 9 wherein said internal interface circuit comprises:

a first multiplexer for generating said first control signal wherein said first multiplexer is coupled to receive said configuration bits for selection control and wherein said first multiplexer receives said input signal and a logical high and a logical low state as inputs; and a second multiplexer for generating said second control signal wherein said second multiplexer is coupled to receive said configuration bits for selection control and wherein said second multiplexer receives said input signal and a logical high and a logical low state as inputs.

14. A configurable input interface circuit as described in claim 9 wherein said input signal is an internal input signal that originates within a portion of said integrated circuit.

15. An input interface circuit having an input node for receiving an input signal, said input interface circuit comprising:

first and second memory cells for storing predetermined logical states therein;

one configurable memory cell for storing programmed configuration information therein; and a first multiplexer for receiving said input signal and for receiving said predetermined logical states of said first and second memory cells;

a second multiplexer for receiving said input signal and for receiving said predetermined logical states of said first and second memory cells;

a pull-up transistor gate responsive to an output of said first multiplexer to control said input node and a pull-down transistor gate responsive to an output of said second multiplexer circuit to control said input node; and wherein said first and second multiplexers are controlled by said configuration information to independently control said pull-up transistor and said pull-down transistor such that said input node is permanently pulled up, permanently pull down, or is pulled up or pulled down as a function of said input signal.

16. An input interface circuit as described in claim 15 further comprising an inverter for generating an inverted input signal wherein said first and second multiplexers are coupled to receive said inverted input signal and are controlled by said configuration information to pull-up or pull-down said input node as a function of said inverted input signal.

17. An input interface circuit as described in claim 15 wherein said pull-up transistor is a p-channel transistor and wherein said pull-down transistors is an n-channel transistor and wherein said input node is an external pad of an integrated circuit.

18. A method for generating an output signal from an interface circuit, said method comprising the steps of:

receiving an input signal over an input node, said input node being an external pad of an integrated circuit;

independently controlling a pull-up device and a pull-down device to pull said input node to a first or to a second logical state in response to a first control signal and an independently generated second control signal;

generating said first control signal and said second control signal in response to a set of programmable configuration information such that said pull-up device and pull-down device are separately programmed to either be permanently on, permanently off, or to be on or off as a function of said input signal; and wherein said output signal is taken from said input node.

19. A method as described in claim 18 wherein said set of programmable configuration information controls said pull-up and pull-down devices such that said input interface circuit acts as a keeper circuit, a pull-up circuit, a pull-down circuit, or a tri-state circuit with respect to said output signal.

20. A method as described in claim 19 wherein said pull-up device is a transistor and wherein said pull-down device is a transistor and wherein said first logical state is a logic high state and wherein said second logical state is a logic low state and wherein said set of programmable configuration information is stored in a programmable memory unit.

* * * * *

UNITED STATES PATENT AND TRADEMARK OFFICE
CERTIFICATE OF CORRECTION

PATENT NO. : 5,600,271
DATED : February 4, 1997
INVENTOR(S) : Charles R. Erickson & Peter H. Alfke It is certified that error appears in the above-identified patent and that said Letters Patent is hereby corrected as shown below:

Col. 7, line 61, "Line is" should read --Line 14 is--.

Col. 8, line 7, "block (OUT port)" should read --block 200 (OUT port)--.

Col. 8, line 8, "21 3." should read --213.--.

Col. 9, line 30, "present 5 invention" should read --present invention--.

Signed and Sealed this

Twenty-fourth Day of March, 1998

Attest:

BRUCE LEHMAN

*Attesting Officer*    *Commissioner of Patents and Trademarks*